US 6,679,146 B2

(12) United States Patent
Balz et al.

(10) Patent No.: US 6,679,146 B2
(45) Date of Patent: Jan. 20, 2004

(54) DIE SET WITH DISPOSABLE MOLYBDENUM DIE PLATE AND IMPROVED WINDOW PLATE FOR UNIVERSAL GANG-PUNCH TOOL

(75) Inventors: James G. Balz, Walden, NY (US); Mark J. LaPlante, Montgomery, NY (US); David C. Long, Wappingers Falls, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 10/045,832

(22) Filed: Jan. 11, 2002

(65) Prior Publication Data

US 2003/0131700 A1 Jul. 17, 2003

(51) Int. Cl.$^7$ .................................................. B26F 1/04
(52) U.S. Cl. ........................... 83/619; 83/687; 83/929.1
(58) Field of Search .......................... 83/13, 619, 687, 83/451, 929.1, 620, 621; 76/107.1

(56) References Cited

U.S. PATENT DOCUMENTS

| 3,477,317 A | * | 11/1969 | Liander ..................... 76/107.1 |
| 5,303,618 A | * | 4/1994 | Norell ....................... 76/107.1 |
| 5,836,226 A | * | 11/1998 | Tsuji et al. .................... 83/129 |
| 5,979,277 A | * | 11/1999 | Kitsuda et al. ................. 83/13 |
| 6,116,127 A | * | 9/2000 | Carbaugh et al. ............... 83/13 |
| 6,119,555 A | * | 9/2000 | DiMaria ..................... 76/107.1 |
| 6,223,636 B1 | * | 5/2001 | LaPlante et al. ................ 83/13 |
| 6,389,940 B1 | * | 5/2002 | Long et al. .................... 83/23 |

* cited by examiner

Primary Examiner—Allan N. Shoap
Assistant Examiner—Ghassem Alie
(74) Attorney, Agent, or Firm—DeLio & Peterson, LLC; John J. Tomaszewski; Ira D. Blecker (57) ABSTRACT

A die and method of gang punching selective holes in thin sheet materials such as greensheets are provided in which slugs of greensheet material formed during the punching operation easily fall through the die and are removed. The die uses a number of plates one of which is a window plate having openings corresponding to openings in a die plate disposed thereon. The window plate openings have a larger diameter than the die plate openings and also a plurality have an oval shape which oval shape openings provide less resistance to the falling slugs and facilitate removal of the slugs from the die. The window plate also preferably has a central grid open area with the remainder of the plate having vertical through-holes corresponding to the through-holes of the die plate. The die also preferably employs a die plate made from at least two sheets of material, i.e., an upper disposable sheet (die plate) and a lower sheet (sub-die plate) wherein the upper die plate is made from a wear-resistant material such as molybdenum. The upper die plate is preferably made by photolithography techniques.

10 Claims, 10 Drawing Sheets

DIE SET WITH DISPOSABLE MOLYBDENUM DIE PLATE AND IMPROVED WINDOW PLATE FOR UNIVERSAL GANG-PUNCH TOOL

BACKGROUND OF THE INVENTION

1. Field of the Invention

This invention relates to an apparatus and method for punching holes in thin sheet material and, more particularly, to a die used with a gang-punch apparatus for punching holes in a desired hole pattern in a greensheet used in the manufacture of electronic components.

2. Description of Related Art

In the manufacture of multilayer ceramic (MLC) substrates for integrated circuit semiconductor package structures, a plurality of green ceramic sheets (commonly termed greensheets) are formed by doctor blading a slurry containing a resin binder, a particulate ceramic material, solvents and a plasticizer, drying the doctor bladed sheet and cutting it into appropriate size sheets. Through-holes, commonly termed vias, are then punched in the greensheets to facilitate forming electrical interconnections through the sheet. Electrically conductive paste is deposited in the holes and in appropriate patterns on the surface of each of the greensheets used to make the MLC substrate, the sheets stacked and laminated, and the assembly subsequently fired at a sintering temperature to form the MLC component.

The formation of the vias in the ceramic material is accomplished in its green state. Prior to being fired, the greensheets are easily deformed and the precision with which the via holes are formed is greatly dependent upon the use of an apparatus which minimizes distortion or disruption to the structural integrity of the greensheet other than forming the via hole. With the size of electrical components constantly being reduced through technical improvement, the positioning of the vias in ceramic greensheets is becoming ever more restrictive. Further, with the increase in the quantity of the electronic circuits that may be positioned and packaged on a small area of the ceramic substrate, a requirement for a larger number of via holes in the greensheet is evident.

Large numbers of holes must be punched into a greensheet with a high degree of precision in order to properly position the holes. At the same time, this punching operation must occur very rapidly in order to produce the large numbers of greensheets that are necessary in the mass production of electronic components.

One method for punching greensheets is using a gang-punching apparatus. A gang-punch is a punch/die set where the punches for a particular ceramic greensheet layer are mounted in a fixed plate. The gang-punch is used to punch the entire greensheet (layer) with a single stroke. A gang-punch has very high throughput and is cost effective for very high volume products. Different gang-punches however are needed to punch each different greensheet layer.

A number of attempts have been made to provide a universal gang-punch apparatus which will economically and efficiently provide the means to make via openings in any pattern on a greensheet. One type apparatus utilizes an interposer mask which contains hole openings where holes are desired to be punched. In these apparatus, a plurality of punch elements arranged in a grid is positioned over the greensheet which is covered by the interposer mask. The die has openings corresponding to all the punch elements. When the punch elements contact the interposer mask as the punch heads are moved downwardly, the holes will be punched where the openings occur since the punch elements would pass through the openings in the interposer mask and through the ceramic greensheet. In other areas covered by the interposer mask, i.e., where holes are not desired, the interposer mask will cause the punch element to be retracted into the punch head. A progressive gang-punch utilizes steel balls on the surface of the punch head at locations of punches to be punched which when a roller traverse the top of the punch head only vias are punched where steel balls are located.

Basically, the gang-punch apparatus uses punch pins mounted in the gang-punch head and the punch head apparatus is placed over a greensheet which is disposed on the surface of a die. The die has openings corresponding to all the punches in the punch apparatus and when the punch apparatus is actuated the punch pins are forced downward and outward from the punch apparatus through the greensheet and through the corresponding openings in the die where the selective holes are desired to be punched. For vias not to be punched, those punch pins in the gang-punch head are not actuated and the desired pattern is obtained. The die necessarily contains corresponding openings for all the punch pins in the gang-punch head so that the desired vias may be formed in any greensheet. A preferred gang-punch apparatus is shown in U.S. Pat. No. 6,223,636, which patent is hereby incorporated by reference.

In operation, punching of the greensheet vias produce a round piece of greensheet material corresponding to the punch size and thickness of the greensheet and this punched material, typically called a slug, is forced downward through the die openings and is removed from the die. Unfortunately however, the slugs may stick and not fall through the die openings and over time may cause a blockage in the die. Continued punching forces the slugs to compact in the die until the punch in the packed hole breaks. The punch head must then be removed and the broken punch replaced causing costly tool downtime.

A gang-punch is also a high-speed punch apparatus capable of punching an entire greensheet every few seconds regardless of the number of vias. Due to the high usage of the gang-punch apparatus, which may be used to punch as many as 10,000 greensheets per day, the die wears rapidly and the die holes wear past there process specification and can no longer be used. One method to increase die life is to apply coatings to the die but this solution has not been successful since the coating distorts the die. It was also found that the coatings wore rapidly around the cutting edge of the die and eventually wore past their process limits and/or cracked and flaked off.

Bearing in mind the problems and deficiencies of the prior art, it is therefore an object of the present invention to provide a die for use with a gang-punch apparatus wherein the slugs formed during the punching operation easily fall through the die and are removed from the die.

It is another object of the present invention to provide a method of punching selective hole patterns in thin sheet materials such as a greensheet using a punch apparatus, in particular, a gang-punch apparatus, wherein slugs formed during the punching operation easily fall through the die and are removed from the die.

Another object of the present invention is to provide a die which has a long operating life and is inexpensive to manufacture with close tolerances of about ±0.0001 inch in hole diameter and hole location is easy to replace quickly and has a top die sheet which is disposable.

Another object of the present invention is to provide a method of forming vias in greensheets using the improved die of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a die which is used with a punch apparatus, particularly a gang-punch apparatus, comprising:

a die support frame having a peripheral edge containing one or more vacuum manifolds with the center of the frame being open;

a groove plate positioned in the die support frame opening and having a plurality of longitudinal channels formed by a plurality of vertical longitudinal supports extending from one side of the groove plate to the other side of the groove plate, the groove plate being substantially the same height as the die support frame;

a window plate disposed on the groove plate and the die support frame comprising a plurality of vertical through-holes, each through hole corresponding to a punch of a punch apparatus and a plurality of the holes having an oval shape with a long axis and a short axis with the long axis being preferably transverse to the longitudinal supports and a number of through openings at the periphery of the plate communicating with the vacuum manifold of the die support frame; and a die plate disposed on the window plate and having vertical through-holes corresponding to punches of a gang-punch apparatus and of the through-holes of the window plate.

In another aspect of the invention the die has a plurality of registration through-holes in each of the plates forming the die to align the die apparatus.

In a further aspect of the invention the window plate has a central area with cross-supports forming a grid with open areas, with the remainder of the window plate outside the central area having the vertical through-holes as discussed above.

In a preferred die apparatus of the invention the die plate is formed from at least two sheets. One sheet is an upper die plate having through-holes corresponding to punch locations in the gang-punch apparatus and of the window plate and which die plate is formed from a wear-resistant material such as molybdenum. The upper die plate is preferably made using photolithographic technologies and is disposable. The other lower sheet is a sub-die plate having corresponding through-holes which are preferably slightly larger than the through-holes in the die plate and openings in the periphery thereof communicating with the vacuum manifold of the die support frame. The sub-die plate is preferably formed from a material such as stainless steel.

In another preferred die of the invention the sub-die plate has a cut-out indent (center-bore) adjacent the registration holes for positioning of the upper die plate on the sub-die plate.

In another aspect of the invention a method is provided for gang punching selective hole patterns in thin sheet materials such as greensheets comprising the steps of:

providing a gang-punch apparatus whereby when the gang-punch apparatus is actuated a number of punches are forced outward and downward from the apparatus;

supplying a die as described above;

supplying a greensheet disposed on top of the die; and actuating the gang-punch apparatus to force punch pins from the gang-punch apparatus through the greensheet into the die forming openings in the greensheet and forming slugs or punched greensheet material which slugs fall through the die and are removed from the die channels.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–9B of the drawings in which like numerals refer to like features of the invention. Features of the invention are not necessarily shown to scale in the drawings.

Figure 1:
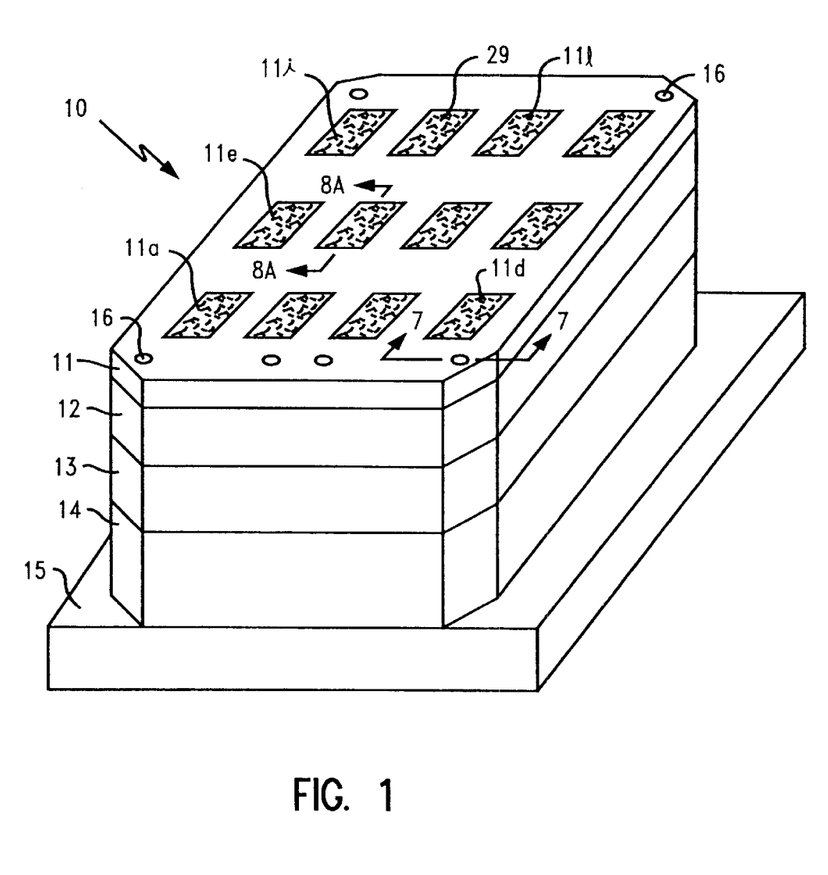
FIG. 1 shows a schematic perspective view of a die of the invention.

Referring to FIG. 1, a die of the invention is shown in perspective generally as numeral 10. The die 10 comprises a top (upper) die plate 11 having a number of identical patterns (twelve total) thereon in the shape of greensheets to be punched and the greensheet patterns are shown as 11*a*–11*l* and are spaced evenly over the surface of die plate 11. Each pattern will be used to make a ceramic substrate (twelve total). Typically a large greensheet would be placed on the die plate 11 and all twelve (12) individual greensheets 11*a*–11*l* formed in one punching operation. After punching, screening, stacking, and lamination, the individual greensheets 11*a*–11*l* are cut from the large greensheet laminate and subsequently fired to form an MLC substrate.

The die plate 11 is preferably a wear-resistant material such as molybdenum and is disposed on a sub-die plate 12 having corresponding through-hole openings corresponding to the through-holes 29 in the greensheet patterns 11a–11l in the die plate 11. The sub-die plate 12 is disposed on top of a window plate 13 which window plate is disposed on top of a die support frame plate 14. The die 10 comprising plates 11, 12, 13 and 14 is disposed on top of a die assembly support plate 15 which is usually a solid rectangular piece of material such as stainless steel, generally about 0.5 inch thick. The purpose of die assembly support plate 15 is to support the die assembly 10 during the punching operation. In general, the punch force required to punch one (1) 0.004 inch hole in a 0.008 inch thick greensheet is about 0.5 pound. A die set with 50,000 punches must therefore support a load of 25,000 pounds. Because the die plate 11 is about 0.003 inch thick a support structure of 12, 13, 14 and 15 is required to support die plate 11.

Not shown in FIG. 1, but discussed hereinbelow, a channel plate 20 is disposed in the opening of the die support frame plate 14 and supports the central portion of the die assembly 10, specifically die plate 11, sub-die plate 12 and window plate 13.

All the above plates of the die 10 have registration holes 16 spaced around the periphery of the assembly. The die registration holes are used to align the plates making up the die.

Figure 2:
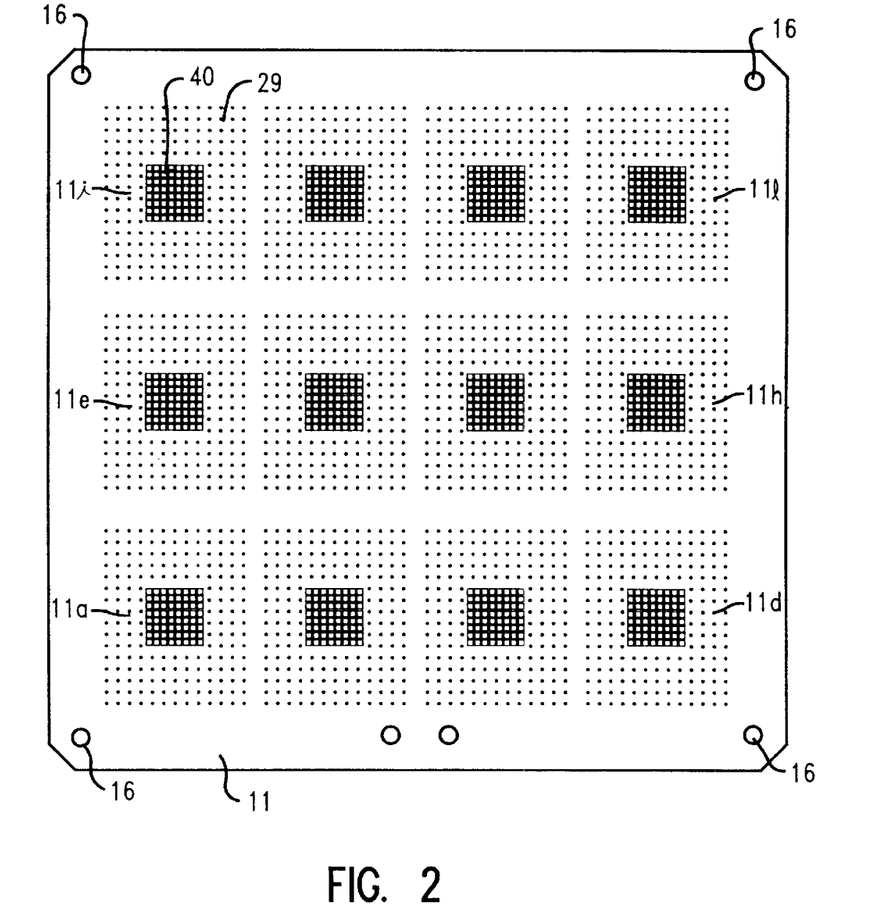
FIG. 2 shows a plan view of the die plate of the die of the invention.

Referring now to FIG. 2, a plan view of the die plate 11 is shown. The greensheet patterns 11a–11l are shown each containing a large number of through-holes 29 which form the pattern to be punched in a greensheet, which greensheet would be placed on top of the die plate and punched by the punch apparatus. Central area 40 has a high density of holes for C4 attach, i.e., solder ball semiconductor chip connections to the top of an MLC substrate.

Figure 3:
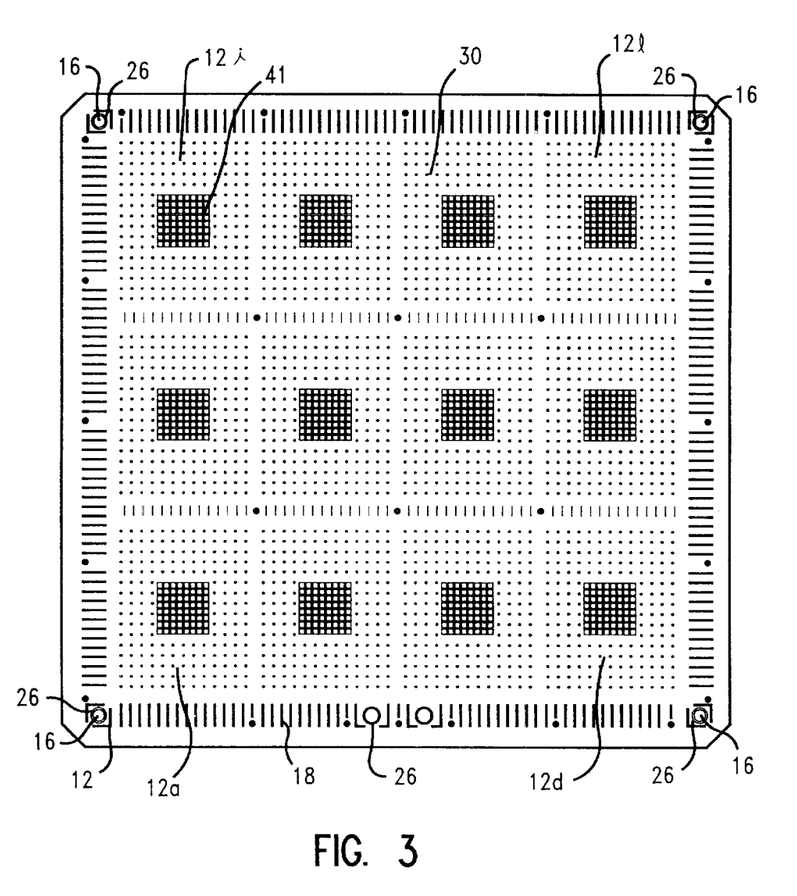
FIG. 3 shows a plan view of the sub-die plate of the die of the invention.

FIG. 3 shows a plan view of the sub-die plate of the invention and likewise has corresponding greensheet patterns 12a–12l, through-holes 30 slightly larger than through-holes 29 and registration holes 16. The sub-die plate 12 also has a number of vacuum openings 18 extending through the sub-die plate around the periphery of the plate. The sub-die plate also has a counter-bore 26 at registration hole 16 to facilitate positioning of the die plate 11 on the sub-die plate 12 as discussed below. A central area 41 has a high density of holes for C4 attach.

Figure 4:
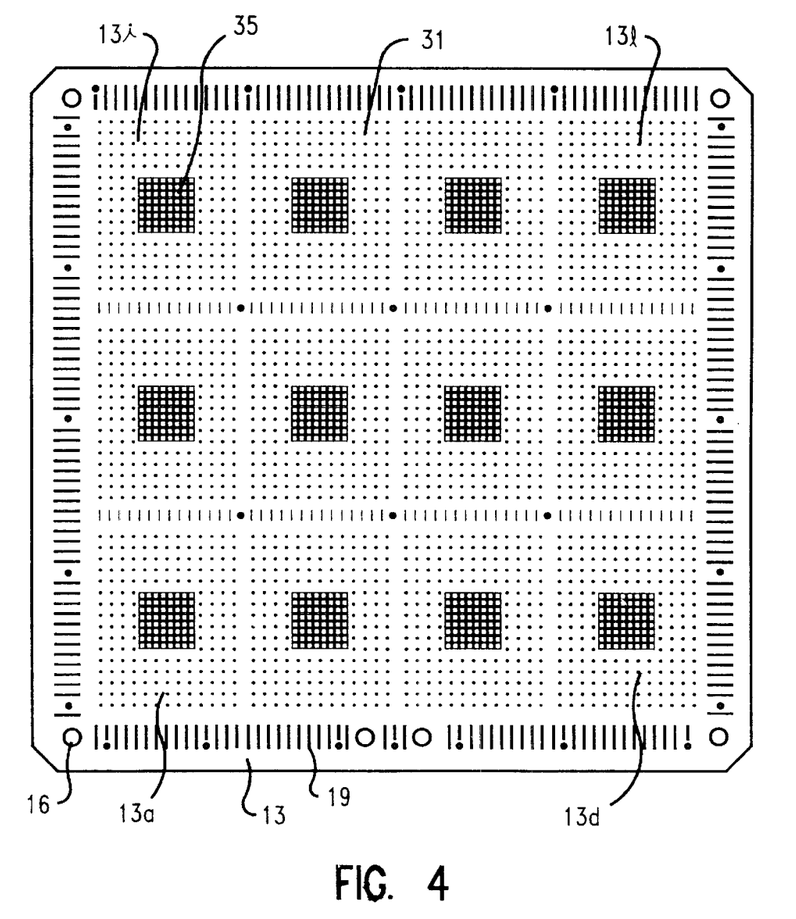
FIG. 4 shows a plan view of the window plate of the die of the invention.

FIG. 4 shows the window plate 13 of the die of the invention and likewise has a number of corresponding greensheet patterns 13a–13l on the surface of the window plate. Registration holes 16 are shown in the plate and a number of vacuum openings 19 are shown spaced around the periphery of the window plate. While it cannot be seen in detail in FIG. 4, many of the through-holes 31 in the greensheet patterns 13a–13l are oval in shape which is an important feature of the present invention. This feature will be seen in FIGS. 4A and 8A–8B.

Figure 4A:
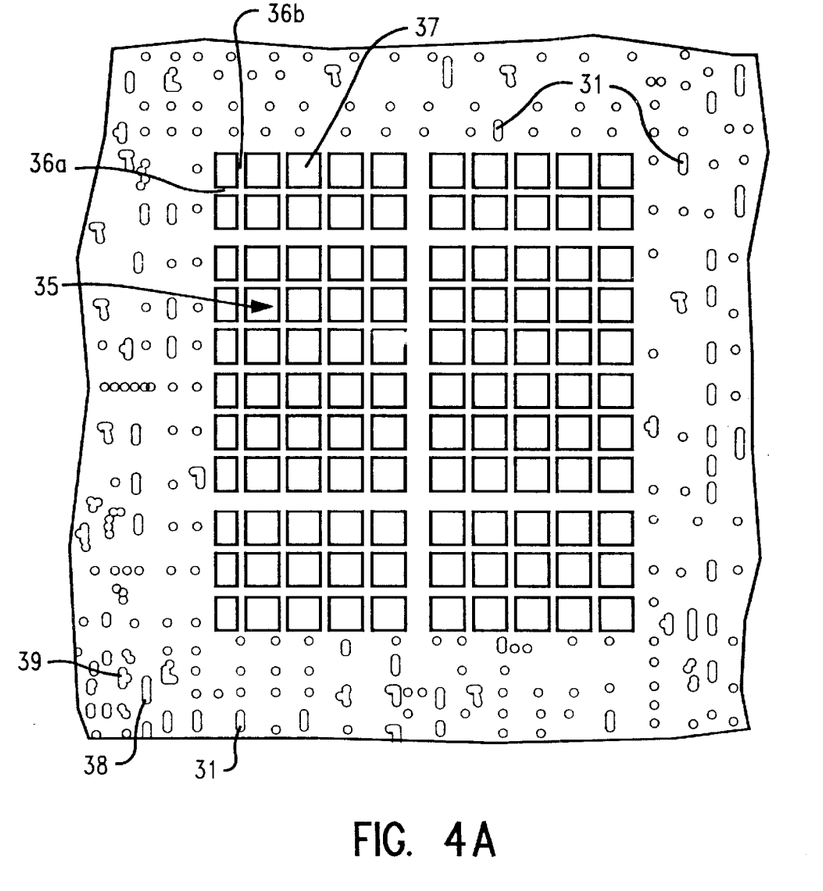
FIG. 4A shows an enlarged partial plan view of one of the greensheet patterns of the window plate of FIG. 4.

As seen in FIGS. 4 and 4A, the window plate 13 has a central area 35 which typically has a high through-hole density since this is a C4 site for chip attachment. The central area 35 preferably has a grid formed by cross-supports 36a and 36b forming open areas 37 which replace the hole openings 31 in the rest of the plate. A number of oval hole openings 31 are shown in FIG. 4A. Depending on the via design, the oval holes may be strung together as shown by numeral 38 or grouped as shown by numeral 39. The oval holes 31 are not needed in central area 35 because of the grid open areas 37 formed by cross-supports 36a and 36b, which are typically 0.002 inch wide. The circular through-holes in the C4 area of the other above plates are typically 0.004 inch on 0.008 inch centers. A conventional window plate may be seen in FIG. 6 of U.S. Pat. No. 6,223,636, supra.

Figure 5:
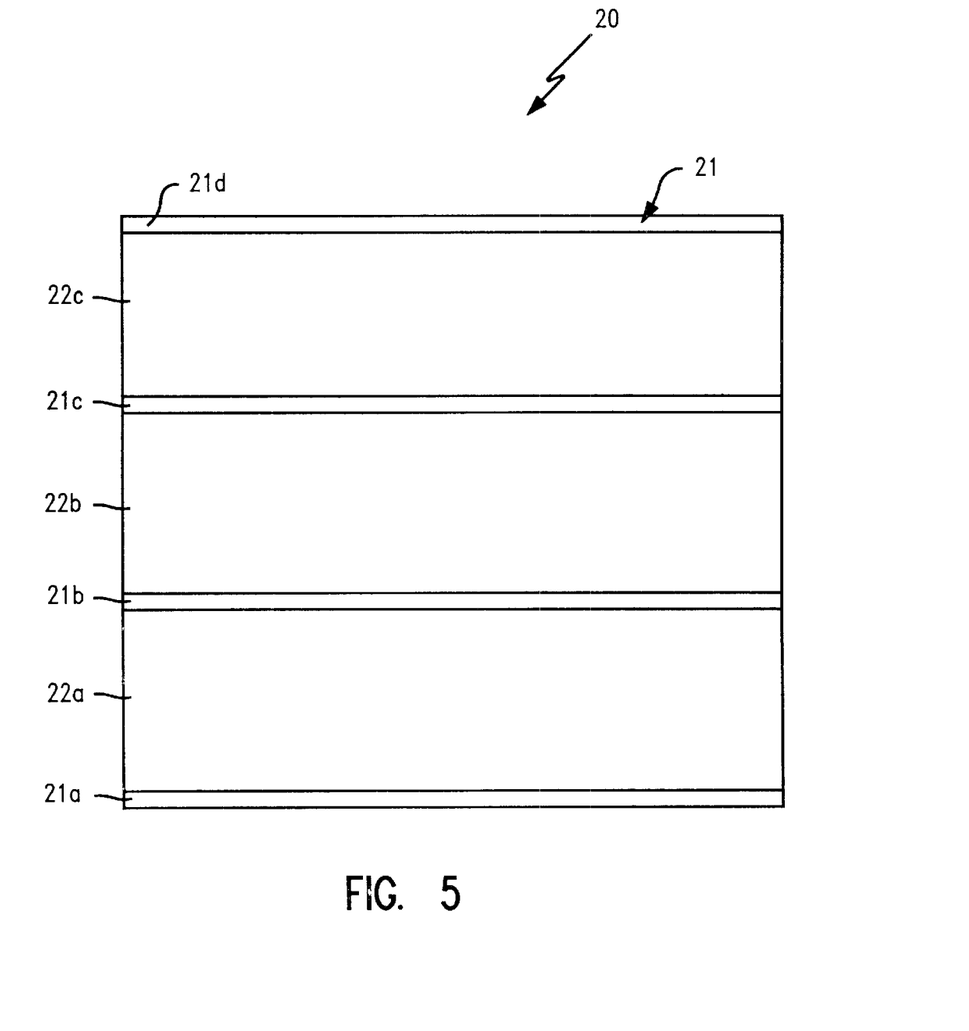
FIG. 5 shows a plan view of the channel plate of the die of the invention.

Referring to FIG. 5, a channel plate 20 of the invention is shown having a number of longitudinal supports 21a–21d running from side-to-side across the channel plate. These supports form channel grooves 22a–22c. It should be noted that the channel plate is smaller in rectangular size than the other plates of the die assembly and fits within the opening of the die support frame shown in FIG. 6.

Figure 6:
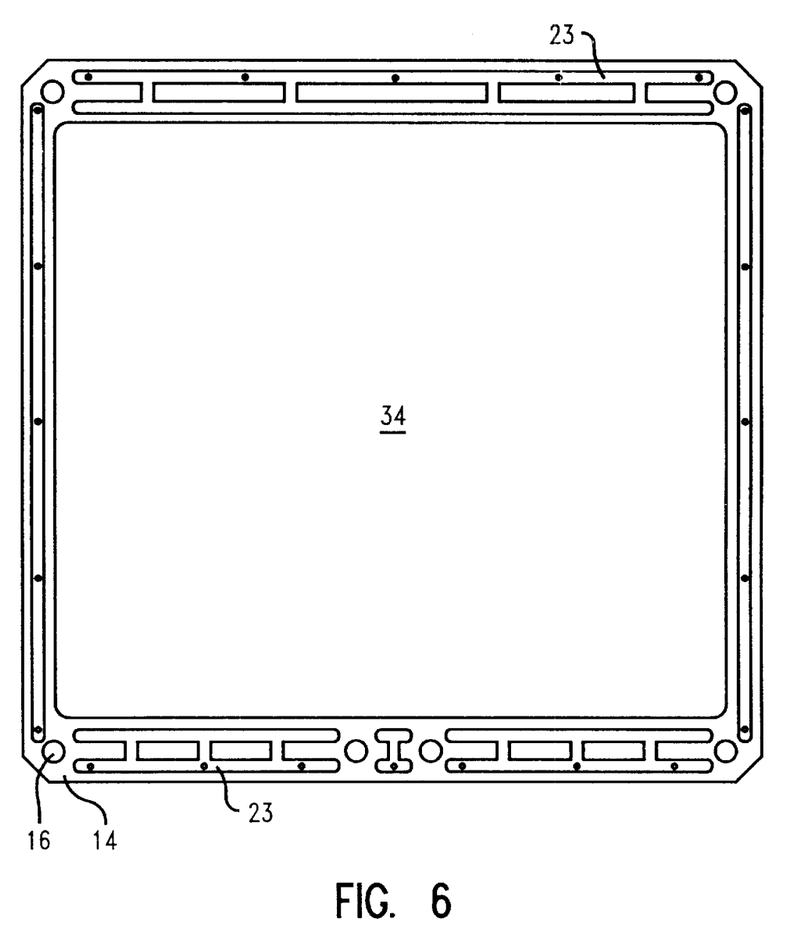
FIG. 6 shows a plan view of the die support frame of the die of the invention.

FIG. 6 shows the die support frame 14 which has a central opening 34. The peripheral edge of the die support frame 14 has a number of vacuum manifolds 23 connected to an external vacuum pump (not shown). Registration holes 16 are also shown in the die support frame 14. As will be more fully discussed hereinbelow, die plate 11, sub-die plate 12, window plate 13, channel plate 20 and die support plate 14 are assembled together and placed on top of die assembly support plate 15 to form the die of the invention. The plates are secured by vacuum around their edges originating from vacuum manifolds 23 in the die support frame 14 and in the central area by vacuum in the die support frame area 34.

Figure 7:
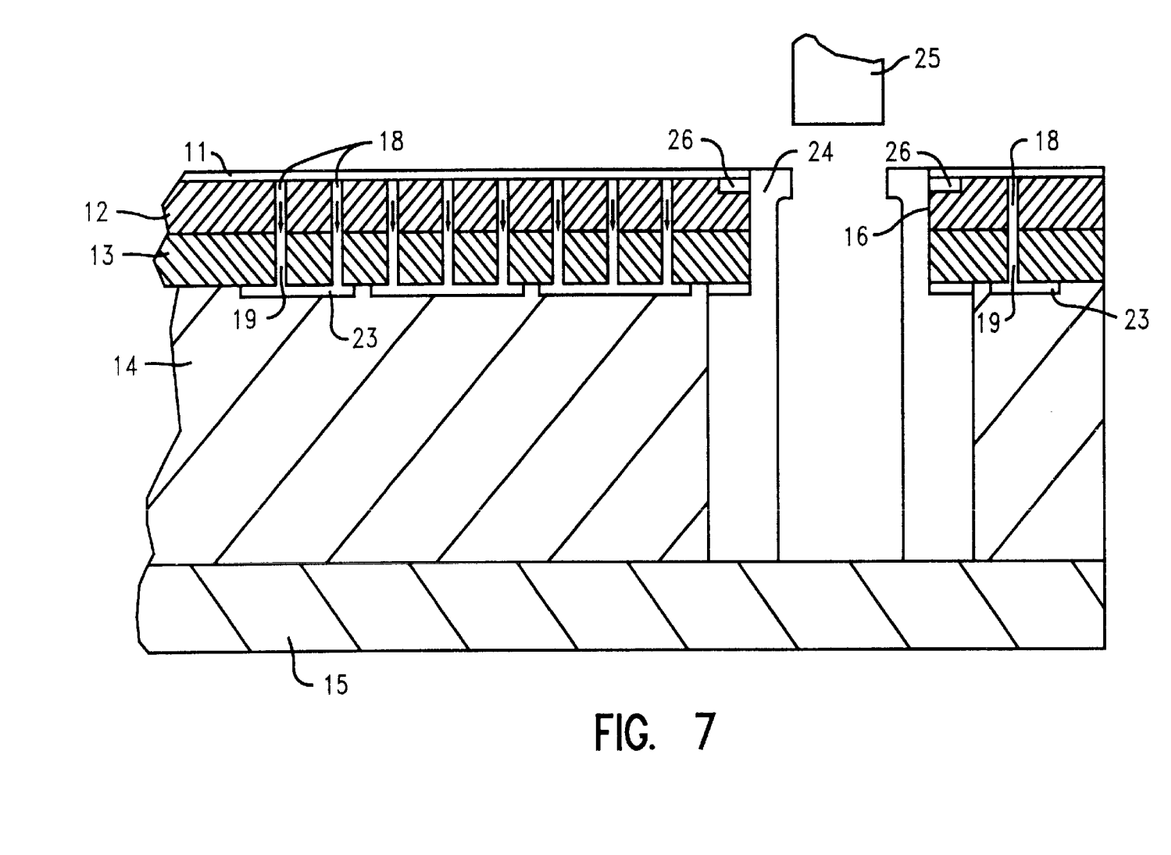
FIG. 7 shows a cross-sectional view taken along line 7—7 of FIG. 1.

FIG. 7 is a partial cross-sectional view of the die apparatus of the invention taken along lines 7—7 of FIG. 1. It should be noted at the outset that since this view is along the periphery of the die that the channel plate 20 is not shown in this cross-section but will be shown in a further cross-section as discussed below.

In FIG. 7 the die plate 11 is positioned on top of sub-die plate 12. Sub-die plate 12 shows vacuum manifold openings 18 which extend through sub-die plate 12 and which vacuum holds down die plate 11 to sub-die plate 12. The die plate 11 does not have peripheral openings. The vacuum openings 18 correspond to the vacuum openings 19 in window plate 13 and both vacuum openings 18 and 19 communicate with the die support frame plate 14 vacuum manifold openings 23. The die support frame plate 14 is positioned below window plate 13 and is positioned on die support plate 15. Sub-die plate 12 has a counter-bore 26 so that when die plate 11 is positioned on the sub-die plate, the die plate 11 can be bent and positioned in the counter-bore 26 to properly position the hole 16 in die plate 11 around the outside diameter of bushing 24. Registration hole 16 is shown having a registration hole bushing 24 preferably made from tungsten carbide which is used to both align plates 11, 12 and 13 and serve as a long lasting die for punch 25. Registration hole punch 25 is shown above bushing 24 and is used to punch holes in the greensheet that are used for registration at screening and stacking on pins for lamination.

Figure 8A:
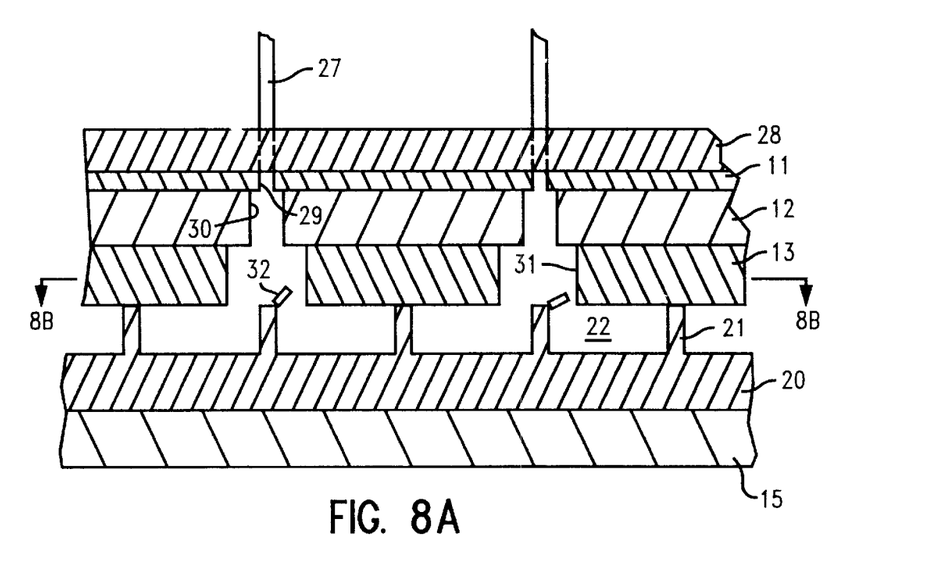
FIG. 8A shows a cross-sectional view of the die of the invention taken along line 8A—8A of FIG. 1.

Referring now to FIG. 8A, this figure shows a cross-sectional view of the die apparatus taken along line 8A—8A of FIG. 1. The die assembly comprises a die plate 11 having through openings 29 therein. The die plate 11 is disposed on top of sub-die plate 12 which has preferably slightly larger openings 30 corresponding to the openings 29 in die plate 11. Sub-die plate 12 is disposed on top of window plate 13 which has openings 31 communicating with the die plate openings 29 and sub-die plate openings 30. Openings 31 are oval in shape to facilitate removal of slugs 32 formed during the punching operation. The window plate 13 is disposed on top of channel plate 20 which has supports 21 extending across the die forming longitudinal channels 22. The channel plate 20 is disposed on top of die assembly support frame plate 15. The height of channel plate 20 above the support plate is the same as the height of the die support frame plate 14 above the support plate.

Figure 8B:
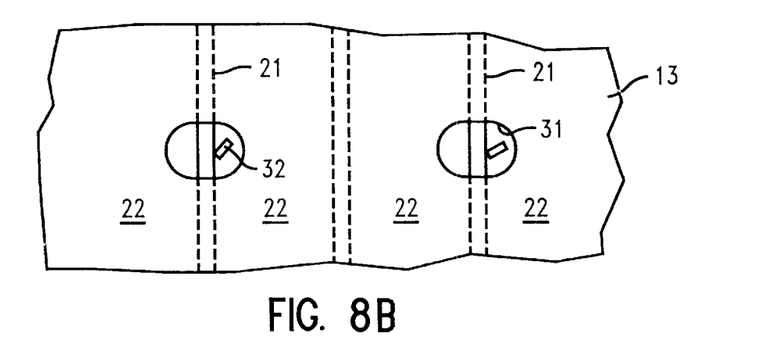
FIG. 8B shows a cross-sectional view of FIG. 8A taken along line 8B—8B of FIG. 8A.

Referring now to FIG. 8B, this figure shows a plan cross-sectional view taken along line 8B—8B of FIG. 8A. Window plate 13 is shown having oval openings 31, the longitudinal axis thereof extending transverse to supports 21. Slugs 32 are shown falling through opening 31 and would fall into channels 22 and are then removed from the die typically by vacuum.

Figure 9A:
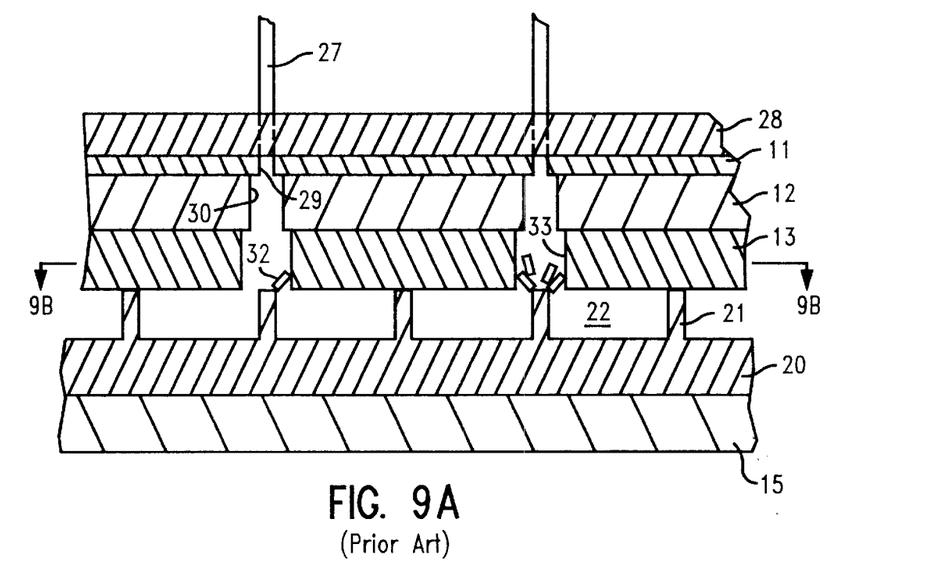
FIG. 9A shows a cross-sectional view of a die of the prior art.
Figure 9B:
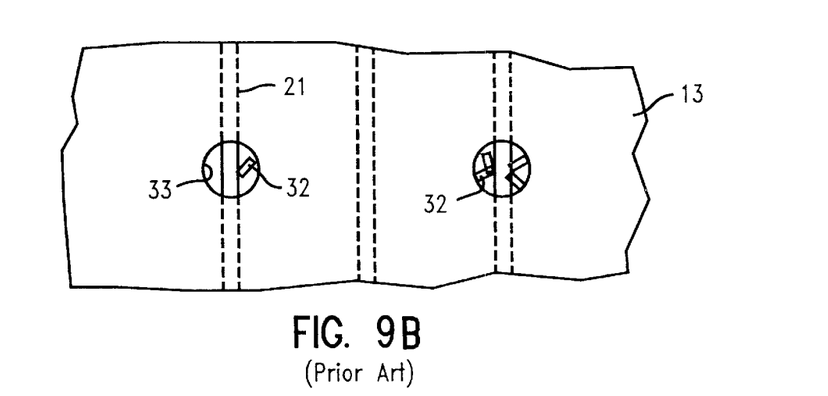
FIG. 9B shows a cross-sectional view taken of FIG. 9A along line 9B—9B of FIG. 9A.

Referring to FIGS. 9A and 9B, these figures show a cross-sectional view of the die assembly of the prior art which has conventional circular window plate openings 33. Thus, the die plate 11 having openings 29 is disposed on a sub-die plate 12 having slightly larger openings 30. The window plate 13 has conventional circular openings 33 and is disposed on top of channel plate 20 which has longitudinal supports 21 forming longitudinal channels 22. The channel plate 20 is disposed on top of die assembly support frame plate 15.

As can be seen from FIG. 9A, slugs 32 formed by the punching of greensheet 28 by punches 27 fall downward through openings 29, 30 and 33 but are blocked from falling into channel 22 by the supports 21. A number of slugs are shown blocking opening 33 and it is this condition which causes blockage in the die openings and possible punch failure.

FIG. 9B shows a plan cross-sectional view taken along line 9B—9B of FIG. 9A and shows the circular opening 33 of window plate 13 being blocked by slugs 32.

An important feature of the invention is to use a thin upper die plate 11 made of a wear resistant material such as molybdenum. This die plate is disposable since it is inexpensive to make. A thin die plate 11 may be accurately made using conventional photolithography wherein a photomask is made using a computer controlled exposure tool. The required vias are generated from substrate design data and the registration holes are likewise generated as part of the design of the die plate. In one embodiment, a photosensitive emulsion is coated on both sides of the sheet of molybdenum. The photomask is placed over the coated molybdenum sheet and exposed to ultraviolet light and the exposed moly plate is removed from the mask. It is preferred to use two (2) photomask artworks, one on top and one on the bottom of the molybdenum sheet. After exposure, the molybdenum sheet is then developed to wash out and remove the exposed areas forming the desired through-hole pattern. The developed plates are then etched to form the desired via holes.

The registration holes 16 are typically about 0.250 inch diameter and are preferably made slightly smaller in size (e.g., 0.248 inch) and then after exposure, developing and etching are precision reamed up to the diameter of 0.250 inch using a standard reamer made of high speed steel or tungsten carbide cobalt of a diameter of 0.2500 inch.

The above photolithography procedure allows an easy and cost effective method for fabricating a die plate. The other plates of the die assembly including the sub-die plate and window plate may be fabricated using conventional techniques and do not have to be as accurate as the die plate because their holes sizes are larger to facilitate removal of the slugs formed during the punching operation.

In general, the thickness of the upper die plate is 0.002 to 0.005 inch, the thickness of the sub-die plate 0.005 to 0.025 inch, the thickness of the window plate 0.005 to 0.025 inch, the height of channel plate 20 supports 21 is about 0.010 to 0.025 inch and about 0.001 to 0.005 inch wide. The width of the channels 22 are about 0.020 to 0.09 inch. Punch 27 is about 0.001 to 0.030 inch diameter, typically 0.004 inch and holes 29 0.0015 to 0.033 inch diameter, typically 0.0047 inch.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A die which is used with a punch apparatus comprising:
   a die support frame having a peripheral edge containing one or more vacuum manifolds with the center of the frame being open;
   a groove plate positioned in the die support frame opening and having a plurality of longitudinal channels formed by a plurality of vertical longitudinal supports extending from one side of the groove plate to the other side of the groove plate, the groove plate being substantially the same height as the die support frame;
   a window plate disposed on the groove plate and the die support frame comprising a plurality of vertical through-holes, each through hole corresponding to a punch of a punch apparatus and a plurality of the holes having an oval shape with a long axis and a short axis with the long axis being transverse to the longitudinal supports and a number of through openings at the periphery of the plate communicating with the vacuum manifold of the die support frame; and
   a die plate disposed on the window plate and having vertical through-holes corresponding to punches of a punch apparatus and of the through-holes of the window plate.

2. The die of claim 1 wherein the die plate comprises two plates, an upper die plate and a lower die plate.

3. The die of claim 2 wherein the upper die plate is made by photolithographic techniques.

4. The die of claim 3 wherein the upper die plate is made of molybdenum.

5. The die of claim 1 wherein some of the oval holes of the window plate are strung together or grouped together.

6. A method for gang punching selective hole patterns in thin sheet materials comprising the steps of:
   providing a gang-punch apparatus whereby when the gang-punch apparatus is actuated a number of punches are forced outward and downward from the apparatus;
   supplying a die comprising:
   a die support frame having a peripheral edge containing one or more vacuum manifolds with the center of the frame being open;
   a groove plate positioned in the die support frame opening and having a plurality of longitudinal channels formed by a plurality of vertical longitudinal supports extending from one side of the groove plate to the other side of the groove plate, the groove plate being substantially the same height as the die support frame;
   a window plate disposed on the groove plate and the die support frame comprising of plurality of vertical through-holes, each through hole corresponding to a punch of a punch apparatus and a plurality of the holes having an oval shape with along axis and a short axis with the long axis being transverse to the longitudinal supports and a number of through openings at the periphery of the plate communicating with the vacuum manifold of the die support frame; and a die plate disposed on the window plate and having vertical through-holes corresponding to punches of a punch apparatus and of the through-holes of the window plate;

supplying a greensheet disposed on top of the die; and actuating the gang-punch apparatus to force punch pins from the gang-punch apparatus through the greensheet into the die forming openings in the greensheet and forming slugs or punched greensheet material which slugs fall through the die and are removed from the die channels.

7. The method of claim 6 wherein the die plate comprises two plates, an upper die plate and a lower die plate.

8. The method of claim 7 wherein the upper die plate is made by photolithographic techniques.

9. The method of claim 8 wherein the upper die plate is made of molybdenum.

10. The method of claim 6 wherein some of the oval holes of the window plate are strung together or grouped together.

* * * * *